United States Patent
DiSanto et al.

(10) Patent No.: US 7,804,236 B2
(45) Date of Patent: Sep. 28, 2010

(54) FLAT PANEL DISPLAY INCORPORATING CONTROL FRAME

(75) Inventors: Frank J. DiSanto, North Hills, NY (US); Denis A. Krusos, Lloyd Harbor, NY (US)

(73) Assignee: Copytele, Inc., Melville, NY (US)

( * ) Notice: Subject to any disclaimer, the term of this patent is extended or adjusted under 35 U.S.C. 154(b) by 0 days.

(21) Appl. No.: 11/378,105

(22) Filed: Mar. 17, 2006

(65) Prior Publication Data

US 2006/0170330 A1 Aug. 3, 2006

Related U.S. Application Data

(63) Continuation-in-part of application No. 10/974,311, filed on Oct. 27, 2004, now Pat. No. 7,327,080, which is a continuation-in-part of application No. 10/782,580, filed on Feb. 19, 2004, now Pat. No. 7,274,136, which is a continuation-in-part of application No. 10/763,030, filed on Jan. 22, 2004, now abandoned, which is a continuation-in-part of application No. 10/102,472, filed on Mar. 20, 2002, now Pat. No. 7,129,626.

(60) Provisional application No. 60/715,191, filed on Sep. 8, 2005, provisional application No. 60/698,047, filed on Jul. 11, 2005.

(51) Int. Cl.
*H01J 1/62* (2006.01)

(52) U.S. Cl. .................. 313/497; 313/310; 313/311; 313/495; 313/496

(58) Field of Classification Search ......... 313/495–497, 313/309–311
See application file for complete search history.

(56) References Cited

U.S. PATENT DOCUMENTS

| | | | |
|---|---|---|---|
| 3,755,704 A | 8/1973 | Spindt et al. | |
| 5,177,406 A | 1/1993 | Troxell | |
| 5,214,347 A | 5/1993 | Gray | |
| 5,345,141 A | 9/1994 | Moyer et al. | |
| 5,541,478 A | 7/1996 | Troxell et al. | |
| 5,736,814 A | 4/1998 | Kinoshita et al. | |
| 5,955,850 A * | 9/1999 | Yamaguchi et al. | 313/495 |
| 6,023,126 A | 2/2000 | Karpov | |
| 6,590,320 B1 | 7/2003 | Abanshin et al. | |
| 6,614,149 B2 | 9/2003 | Kastalsky et al. | |
| 6,674,242 B2 | 1/2004 | Kastalsky et al. | |
| 6,690,116 B2 * | 2/2004 | Song et al. | 315/169.3 |

(Continued)

OTHER PUBLICATIONS

"Nano SU-8 Negative Tone Photoresist Formulations 2-25", Micro Chem, 4 pages, Rev. 2/02.

(Continued)

*Primary Examiner*—Bumsuk Won
(74) *Attorney, Agent, or Firm*—Plevy & Keene, LLP

(57) ABSTRACT

A flat panel display including: a plurality of electrically addressable pixels; a plurality of thin-film transistor driver circuits each being electrically coupled to an associated at least one of the pixels, respectively; a passivating layer on the thin-film transistor driver circuits and at least partially around the pixels; a conductive frame on the passivating layer; and, a plurality of nanostructures on the conductive frame; wherein, exciting the conductive frame and addressing one of the pixels using the associated driver circuit causes the nanostructures to emit electrons that induce the one of the pixels to emit light.

18 Claims, 5 Drawing Sheets

U.S. PATENT DOCUMENTS

| | | | |
|---|---|---|---|
| 2002/0011777 A1* | 1/2002 | Konishi et al. | 313/495 |
| 2002/0079802 A1* | 6/2002 | Inoue et al. | 313/309 |
| 2002/0080099 A1* | 6/2002 | Song et al. | 345/75.2 |
| 2002/0134978 A1 | 9/2002 | Kastalsky et al. | |
| 2002/0163287 A1* | 11/2002 | Cheng et al. | 313/309 |
| 2002/0175617 A1* | 11/2002 | Lee et al. | 313/495 |
| 2003/0057513 A1* | 3/2003 | Leedy | 257/506 |
| 2003/0090190 A1 | 5/2003 | Takai et al. | |
| 2004/0058153 A1 | 3/2004 | Ren et al. | |
| 2004/0222734 A1 | 11/2004 | Oh | |

OTHER PUBLICATIONS

K.B.K. Teo et al., "Uniform Patterned Growth of Carbon Nanotubes Without Surface Carbon", Applied Physics Letters, vol. 79, No. 10, pp. 1534-1536, Sep. 3, 2001.

C. J. Spindt et al., "9.2: ThinCRT Flat-Panel-Display Construction and Operating Characteristics", SID-98 Digest, pp. 99-102, 1998.

C.A. Spindt, "A Thin-Film Field-Emission Cathode", Journal of Applied Physics, vol. 39, No. 7, pp. 3504-3505, Jun. 1968.

Shoushan Fan et al., "Self-Oriented Regular Arrays of Carbon Nanotubes and Their Field Emission Properties", Science Magazine, vol. 283, pp. 512-514, Jan. 22, 1999.

Jaemyung Kim et al., "Growth and Field Emission of Carbon Nanotubes on Electroplated Ni Catalyst Coated on Glass Substrates", Journal of Applied Physics, vol. 90, No. 5, pp. 2591-2594, Sep. 1, 2001.

Z. F. Ren et al., "Growth, Characterization, and Potential Applications of Periodic Carbon Nanotube Arrays", 2 pages.

Bingqing Wei et al., "Lift-Up Growth of Aligned Carbon Nanotube Patterns", Applied Physics Letters, vol. 77, No. 19, pp. 2985-2987, Nov. 6, 2000.

* cited by examiner

FLAT PANEL DISPLAY INCORPORATING CONTROL FRAME

RELATED APPLICATIONS

This application claims the benefit under 35 U.S.C. 119(e) of U.S. Provisional Applications Nos. 60/698,047, filed Jul. 11, 2005 and 60/715,191, filed Sep. 8, 2005, the entire disclosures of each of which are all hereby incorporated by reference herein. This application also claims priority to as a continuation-in-part of U.S. patent application Ser. No. 10/974,311 entitled "Hybrid Active Matrix Thin-Film Transistor Display," filed on Oct. 27, 2004 now U.S. Pat. No. 7,327,080, which is a continuation in part of U.S. patent application Ser. No. 10/782,580 entitled "Hybrid Active Matrix Thin-Film Transistor Display", filed on Feb. 19, 2004 now U.S. Pat. No. 7,274,136, which is a continuation in part of U.S. patent application Ser. No. 10/763,030, entitled "Hybrid Active Matrix Thin-Film Transistor Display", filed on Jan 22, 2004 now abandoned, which is a continuation in part of U.S. patent application Ser. No. 10/102,472, entitled "Pixel Structure For An Edge-Emitter Field-Emission Display", filed on Mar. 20, 2002 now U.S. Pat. No. 7,129,626.

FIELD OF THE INVENTION

This application is generally related to the field of displays and more particularly to flat panel displays using nanotubes and Thin Film Transistor (TFT) technology.

BACKGROUND OF THE INVENTION

Flat panel display (FPD) technology is one of the fastest growing display technologies in the world, with a potential to surpass and replace Cathode Ray Tubes (CRTs) in the foreseeable future. As a result of this growth, a large variety of FPDs exist, which range from very small virtual reality eye tools to large hang-on-the-wall television displays.

It is desirable to provide a display device that may be operated in a noontide configuration, and that exhibits a uniform, enhanced and adjustable brightness with good electric field isolation between pixels. Such a device would be particularly useful as a FPD, such as a low voltage nanotube display (LVND), incorporating a nanotube-based electron emission system, a pixel control system, and phosphor based pixels, with or without memory.

SUMMARY OF THE INVENTION

A flat panel display including: a plurality of electrically addressable pixels; a plurality of thin-film transistor driver circuits each being electrically coupled to an associated at least one of the pixels, respectively; a passivating layer on the thin-film transistor driver circuits and at least partially around the pixels; a conductive frame on the passivating layer; and, a plurality of nanostructures on the conductive frame; wherein, exciting the conductive frame and addressing one of the pixels using the associated driver circuit causes the nanostructures to emit electrons that induce the one of the pixels to emit light.

In one exemplary embodiment, there is provided a thin, phosphor-based active TFT matrix flat panel vacuum display. Surrounding each pixel in the matrix is a control conductive frame which contains carbon nanotubes. Each pixel has color or monochrome phosphors which are activated by electrons created by a voltage potential between the frame and the pixel. The electrons strike the phosphor and cause the phosphor to emit light. Each pixel is addressed through a TFT matrix structure (e.g. a memory TFT matrix).

BRIEF DESCRIPTION OF THE DRAWINGS

It is to be understood that the accompanying drawings are solely for purposes of illustrating the concepts of the invention and are not drawn to scale. The embodiments shown in the accompanying drawings, and described in the accompanying detailed description, are to be used as illustrative embodiments and should not be construed as the only manner of practicing the invention. Also, the same reference numerals, possibly supplemented with reference characters where appropriate, have been used to identify similar elements.

DETAILED DESCRIPTION OF THE INVENTION

Figure 1:
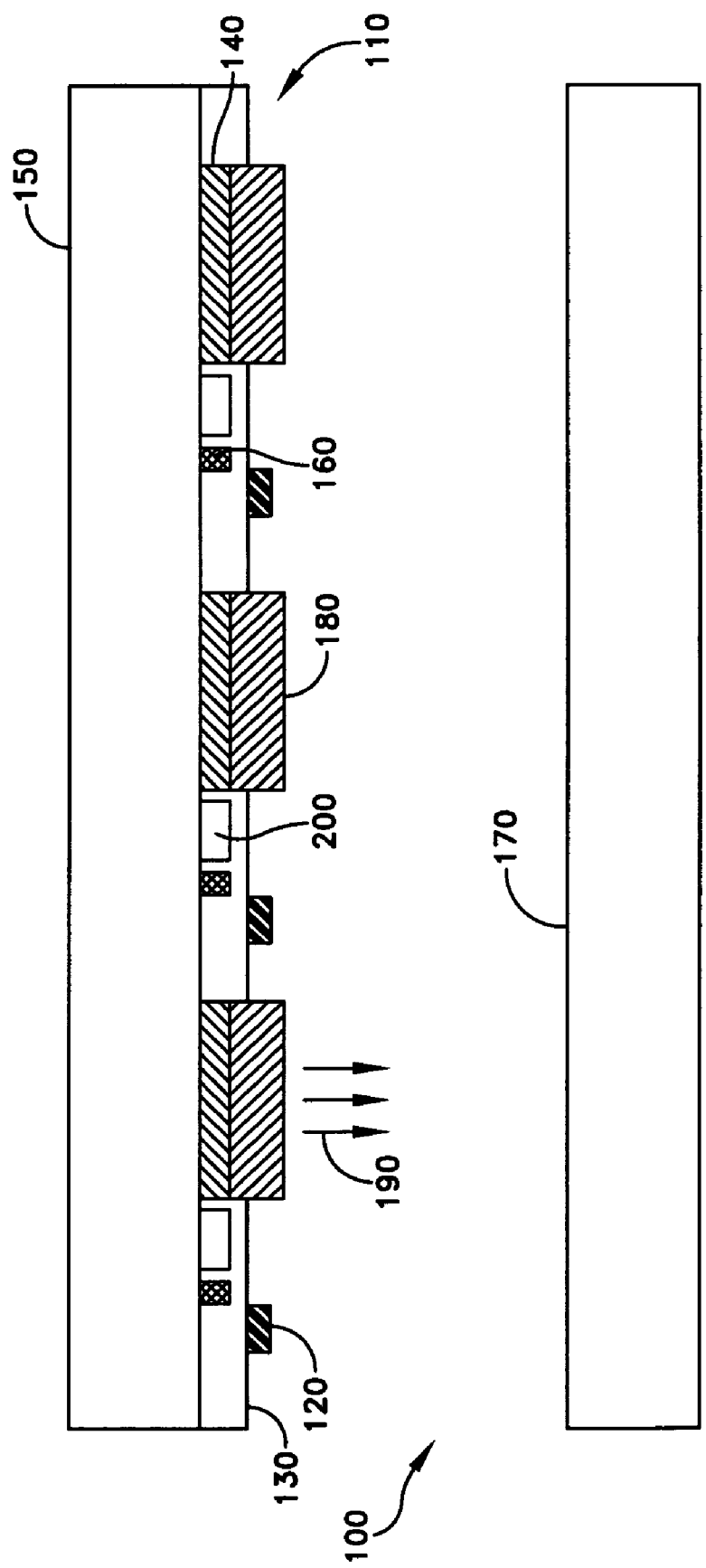
FIG. 1 illustrates an exemplary display device according to an aspect of the present invention.

It is to be understood that the figures and descriptions of the present invention have been simplified to illustrate elements that are relevant for a clear understanding of the present invention, while eliminating, for the purpose of clarity, many other elements found in typical FPD systems and methods of making and using the same. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

Before embarking on a more detailed discussion, it is noted that passive matrix displays and active matrix displays are FPDs that are used extensively in various display devices, such as laptop and notebook computers, for example. In a passive matrix display, there is a matrix of solid-state elements in which each element or pixel is selected by applying a potential voltage to a corresponding row and column line that forms the matrix. In an active matrix display, each pixel is further controlled by at least one transistor and a capacitor that is also selected by applying a potential to a corresponding row and column line. Part of the invention lies in the recognition that a TFT-based display device with a control frame disposed thereon exhibits enhanced performance and effects useful for display devices. Electron emission sources may be used with such a frame to form a cold cathode configuration, such as one including edge emitters and/or nanotube emitters.

According to an aspect of the present invention, a pixel matrix control system having a control frame around each pixel associated with a thin film transistor (TFT) circuit of a display device is used to provide a display characterized as having a good uniformity, adjustable brightness, and a good electric field isolation between pixels, regardless of the type of electron source used. For purposes of completeness, a TFT is a type of field effect transistor made by depositing thin films for the metallic contacts, semiconductor active layer, and dielectric layer. TFT's are widely used in liquid crystal display (LCD) FPDs.

The control frame surrounds the pixel and hence, the TFT, and is disposed in an inactive area between the pixels (e.g. on an insulating substrate over the respective columns and rows). The control frame can accommodate carbon nanotube electron emission structures, and be suitable for operation at low voltages, such as a maximum voltage of less than around 40 volts. In an exemplary configuration, the device operates as a thin LVND.

According to an aspect of the present invention the electron emitting structures take the form of nanostructures, such as carbon nanotubes. The diameter of a nanotube is typically on the order of a few nanometers. According to an aspect of the present invention, single-wall carbon nanotubes (SWNTs) and/or multiple wall carbon nanotubes (MWNTs) may be used.

According to an aspect of the present invention, the control frame includes a plurality of conductors, typically arranged in a matrix having parallel horizontal conductors and parallel vertical conductors. Each pixel is bounded by the intersection of vertical and horizontal conductors, such that the conductors surround the corresponding pixels to the right, left, top, and bottom in a matrix fashion. One or more conductive pixel pads are electrically connected to the control frame. The control frame may be fabricated of a metal including, for example, chrome, molybdenum, aluminum, and/or combinations thereof.

According to an aspect of the present invention, the control frame can be formed using standard lithography, deposition and etching techniques.

In one exemplary configuration, conductors parallel to columns and rows are electrically connected together, and a voltage is applied thereto. In another exemplary configuration, conductors parallel to columns are electrically connected together, and have a voltage applied thereto. Conductors parallel to the rows are also connected together, with a voltage applied thereto. In yet another exemplary configuration, a voltage is only applied to one of the parallel rows or columns of conductors.

According to an aspect of the present invention, a vacuum FPD incorporating a TFT circuit may be provided. Associated with each pixel element is a TFT circuit that is used to selectively address that pixel element in the display. In one configuration the TFT circuit includes first and second active device electrically cascaded, and a capacitor coupled to an output of the first device and an input of the second device.

Referring now to the figures, FIG. 1 illustrates a schematic cross-sectional view of a TFT anode based FPD 100 according to an aspect of the present invention. In the exemplary embodiment, display 100 is composed of an assembly 110 that includes an anode and that employs TFT circuitry to control the attraction of electrons, and a control frame structure 120 disposed on anode passivation layer 130. The control frame substantially surrounds each of the pixel elements, and supports electron emitting nantoubes. In the illustrated embodiment, the pixel metal 140 operates as the anode, which attracts electrons emitted by the frame supported emitters.

Assembly 110 includes a plurality of conductive pixel pads 140 fabricated in a matrix of substantially parallel rows and columns on a substrate 150 using conventional fabrication methods. Column lines 160 are associated with each of the corresponding pads 140. Substrate 150 may be formed of a transparent material, such as glass, or a flexible material (such as a plastic with no internal outgassing during sealing and vacuumization processing), but may be opaque. Substrate 170, which serves to confine the FPD housing in an evacuated environment may also be made of a transparent (or at least translucent) material, such as glass or flexible material, but alternatively may be opaque. Conductive pixel pads 140 may be composed of a transparent conductive material, such as ITO (Indium Titanium Oxide) or a non-transparent conductor such as Chrome (Cr), Moly Chrome (MoCr) or aluminum.

Deposited on each conductive pixel pad 140 is phosphor layer 180. Each phosphor layer(s) 180 is selected from materials that emit light 190 of a specific color, wavelength, or range of wavelengths. In a conventional RGB display, phosphor layer 180 is selected from materials that produce red light, green light or blue light when struck by electrons. In the illustrated embodiment, light (i.e. photons) is emitted in the direction of substrate 170 for viewing. If the pixel metal is of a transparent (or translucent) material (such as ITO) rather than opaque, light emissions 190 would be transmitted in both the directions of substrates 150 and 170 (rather than being reflected via the pixel metal to substrate 170 only, for example).

Incorporated in the TFT circuit are conductive pixel column and row addressing lines associated with each of the corresponding conductive pixel pads 140. The pixel row and column addressing lines may be substantially perpendicular to one another. Such a matrix organization of conductive pixel pads and phosphor layers allows for X-Y addressing of each of the individual pixel elements in the display as will be understood by those possessing an ordinary skill in the pertinent arts.

Associated with each conductive pixel pad 140/phosphor layer 180 pixel is a TFT circuit 200 that operates to apply an operating voltage to the associated conductive pixel pad 140/phosphor layer 180 pixel element. TFT circuit 200 operates to apply either a first voltage to bias an associated pixel element to maintain it in an "off" state or a second voltage to bias the associated pixel element to maintain it in an "on" state, or any intermediate state. In this illustrated case, conductive pixel pad 140 is inhibited from attracting electrons when in an "off" state, and attracts electrons when in an "on" or any intermediate state.

TFT circuitry 200 biasing conductive pixel pad 140 provides for the dual functions of addressing pixel elements and maintaining the pixel elements in a condition to attract electrons for a desired time period, i.e., time-frame or sub-periods of time-frame.

Figure 2:
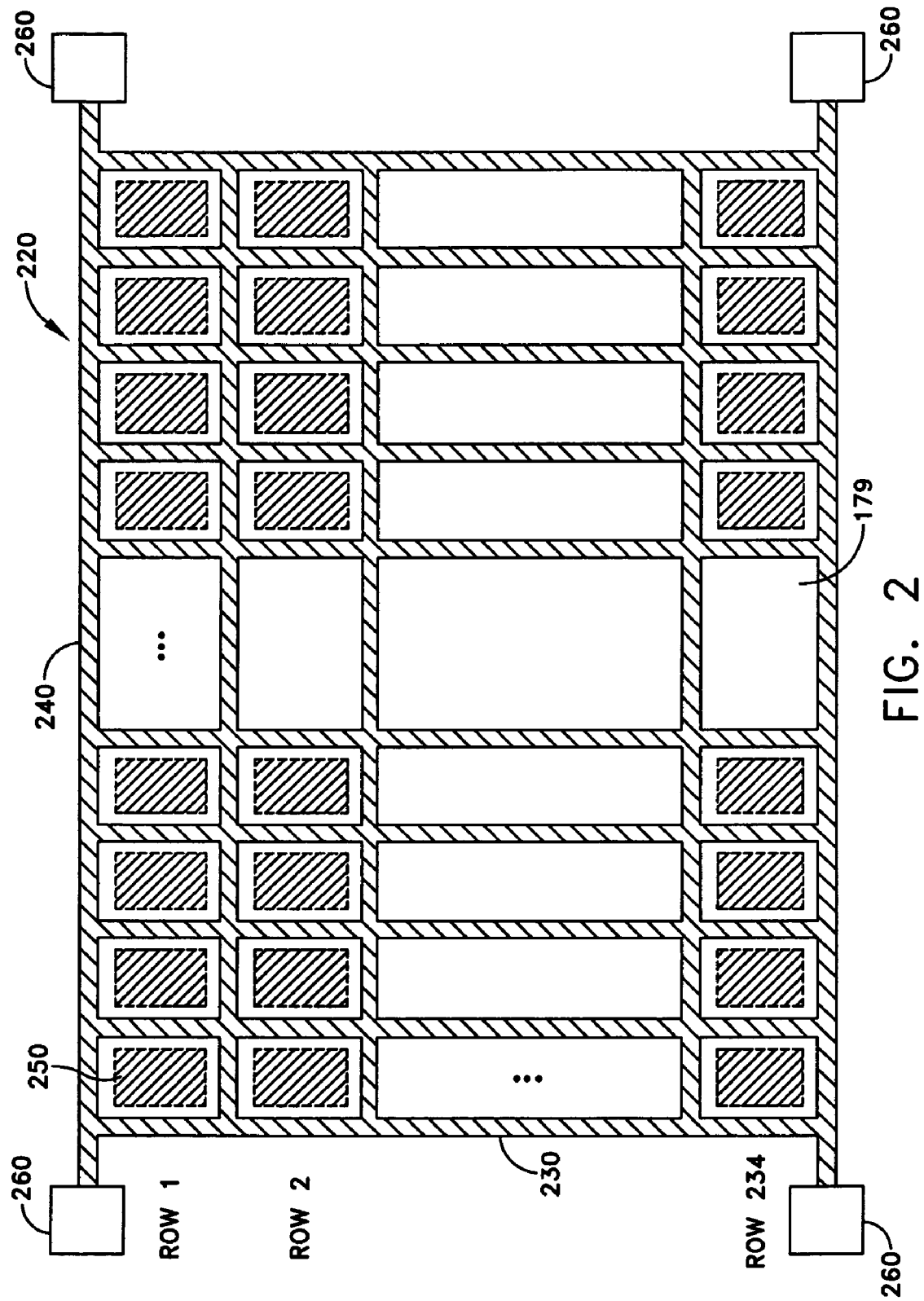
FIG. 2 illustrates a control frame around each pixel and having a fixed voltage according to an aspect of the present invention.

Referring now also to FIG. 2, there is shown a plan view of a control frame 220 suitable for use as control frame 120 of FIG. 1. Control frame 220 includes a plurality of conductors arranged in a rectangular matrix having parallel vertical conductive lines 230 and parallel horizontal conductive lines 240, respectively. Each pixel 250 (e.g., pad 140 and phosphor 180 of FIG. 1) is bounded by vertical and horizontal conductors or lines 230, 240, such that the conductors substantially surround each pixel 250 to the right, left, top, and bottom. One or more conductive pads 260 electrically connect conductive frame 220 to a conventional power source. In the illustrated embodiment of FIG. 2, four conductive pads 260 are coupled to the conductive lines 230, 240 of frame 220. In an exemplary embodiment, each pad 260 is around 100×200 micrometers (microns) in size.

Figure 2A:
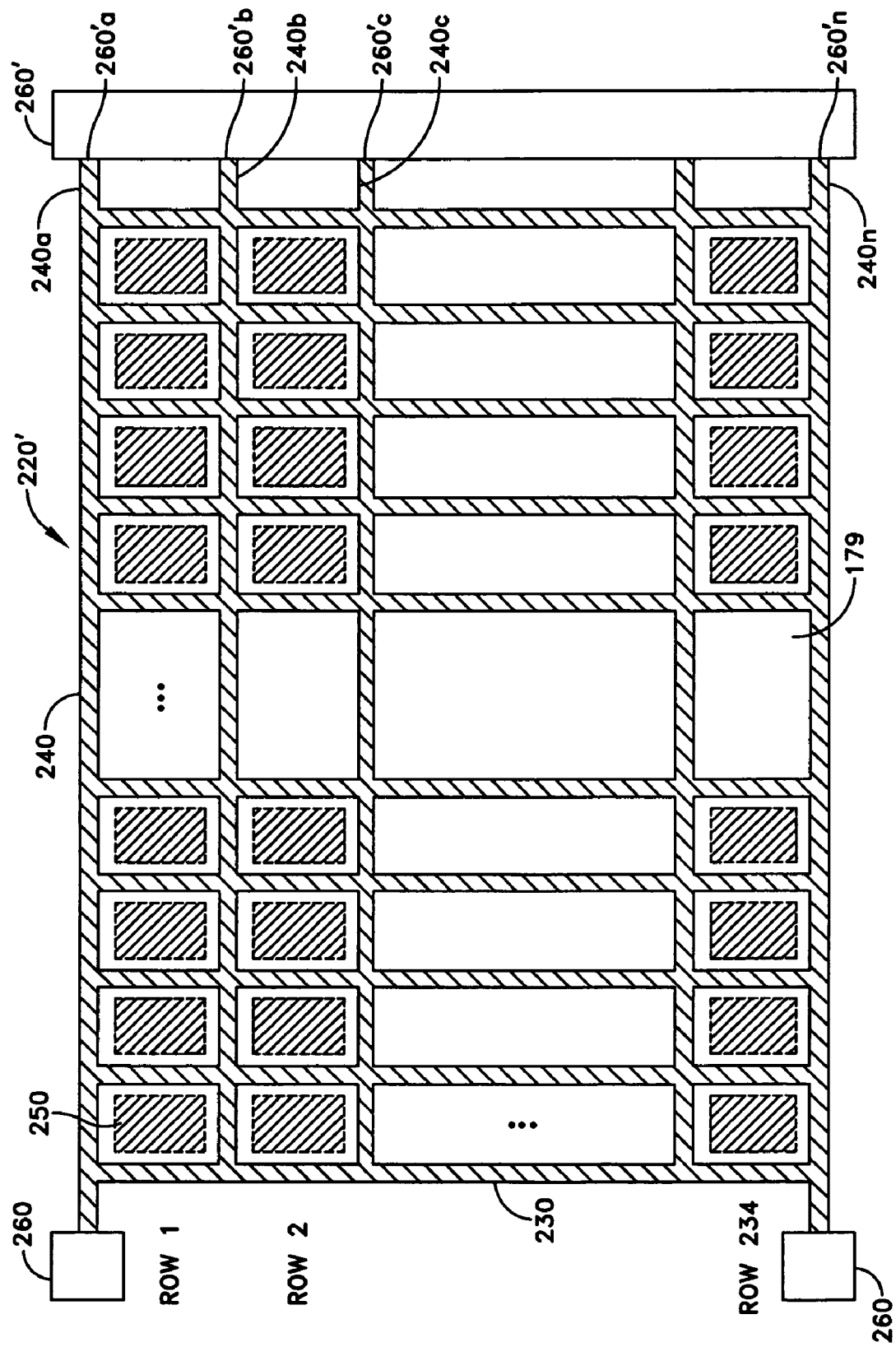
FIG. 2a illustrate a control frame according to another aspect of the present invention.

FIG. 2a shows another exemplary configuration of a control frame structure similar to that of FIG. 2 (wherein like reference numerals are used to indicate like parts), but wherein two of the pads 260 of FIG. 2 are replaced by a single conductive bar or bus 260'. The conductive bar 260' is coupled to each of the parallel horizontal conductive lines $240_a$, $240_b$, $240_c$, ..., $240_n$ at corresponding positions $260_a$, $260_b$, $260_c$, ..., $260_n$ along the bar. In the illustrated configuration, the row lines are substantially identical to one another and interconnect to the bar at uniform spacings along the length of the bar. This configuration provides for an equipotential frame configuration with minimal voltage drops as a function of frame position.

In the illustrated embodiment control frame 220 (or 220') is formed as a metal layer above the final passivation layer (e.g., 130, FIG. 1). Pads 260 and metal lines that provide the control frame structure 220 remain free from passivation in the illustrated embodiment. In an exemplary configuration, the control frame metal layer has a thickness of less than about 1 micron (μm), and a width on the order of about 16-19 microns, although other thicknesses and widths may be used depending on particular design criteria.

Figure 4:
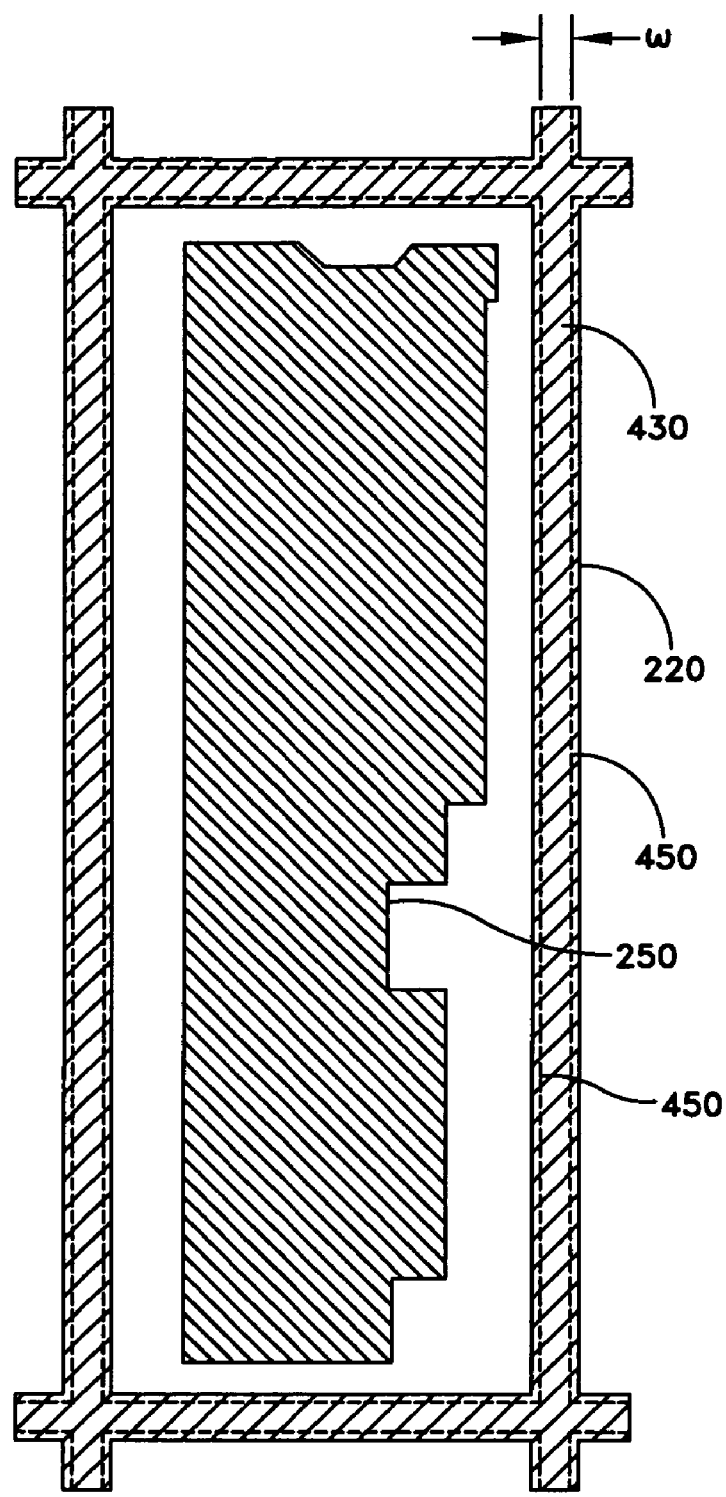
FIG. 4 illustrates a top view of a control frame according to another aspect of the present invention.

Referring to FIG. 4, the conductive part of frame 220 may be widened (e.g. by about 4 um) and an insulating layer 450 (e.g. SiN) provided at each edge for preventing electrical short circuits from the frame to the pixels, and to encapsulate the frame edge which is associated with high field intensity. Accordingly, the exposed part 430 of the frame may have a width w of about 12-15 um.

According to an aspect of the present invention, nanostructures are provided upon control frame 220. The nanostructures may take the form of carbon nanotubes, for example. The nanostructures may take the form of SWNTs or MWNTs. The nanostructures may be applied to the control frame using any conventional methodology, such as spraying, growth, electrophoresis, or printing, for example.

By way of further non-limiting example only, where electrophoresis is used to apply nanotubes to frame 220, about 5 mg of commercially available carbon nanotubes may be suspended in a mixture of about 15 mL of Toluene and about 0.1 mL of a surfactant, such as polyisobutene succinamide (OLOA 1200). The suspension may be shaken in a container with beads for around 3-4 hours. Thereafter, the frame may be immersed in the shaken suspension, while applying a DC voltage to the frame that is negative relative to a suspension electrode (where the nanotubes have a positive charge).

While the vertical line conductors 230 and horizontal line conductors 240 frame each pixel 250 above the plane of the pixels 250 in the illustrated embodiment (see, e.g., FIG. 1), other configurations are contemplated, such as where the conductors are disposed in the same plane as the pixels. Further yet, conductors 230, 240 may be connected in a number of configurations. For example, in one configuration, all horizontal and vertical conductors are joined together as shown in FIG. 2 and a voltage is applied to the entire control frame configuration. In another configuration, all horizontal conductors 240 are joined and separately all vertical conductors 230 are joined. In this connection configuration the horizontal conductors 240 and vertical conductors 230 are not electrically interconnected. Thus, a voltage may be applied to the horizontal conductor array, and a separate voltage may be applied to the vertical conductor array. Other configurations are also contemplated, including for example, a configuration of all horizontal conductors only, or a configuration of all vertical conductors only. For example, the control frame may include only metal lines parallel to the columns or only metal lines parallel to the rows.

Regardless of the particulars, a voltage ($V_{TN}$) equal to ($V_{PIXEL(Low)}$−($V_{THN}$)) may be applied to the frame via pads 260, where ($V_{THN}$) represents the nanostructure emitting threshold and $V_{PIXEL(low)}$ represents the minimum pixel voltage. This voltage may serve to keep the frame supported nanostructures to just below the emitting threshold when the pixel voltage is in it's "OFF" state. This permits the pixel voltage to transition from the "OFF" state to the "ON" state and all voltages in between to cause changes in brightness (Gray Scale).

The anode (pixel) voltage ($V_{PIXEL}$) of each pixel determines the brightness or color intensity of that pixel. By positively biasing the pixel voltage ($V_{PIXEL}$) relative to the voltage of the frame, the voltage on that pixel is increased beyond the emitting threshold of the nanotubes ($V_{THN}$), such that the frame supported nanostructures in the region around a biased pixel are caused to emit electrons, which are then attracted to the positively biased pixel. In other words, when the voltage applied to the pixel ($V_{PIXEL}$) relative to the voltage applied to the control frame nanostructures ($V_{TN}$), exceeds the emission threshold voltage ($V_{THN}$), electrons are emitted from the nanostructures. The electrons emitted from the nanostructures move to the anode (phosphor), thereby causing the phosphor to emit light, $V_{PIXEL} \geq V_{TN} + V_{THN}$. The wavelength of the emitted light depends upon the phosphor. The electron flow to the anode (i.e. pixel current) is a function of the pixel voltage, thereby producing an illumination which is proportional to the amplitude of column data, when the voltage signal applied to the pixel is proportional to the amplitude of the data.

Figure 3:
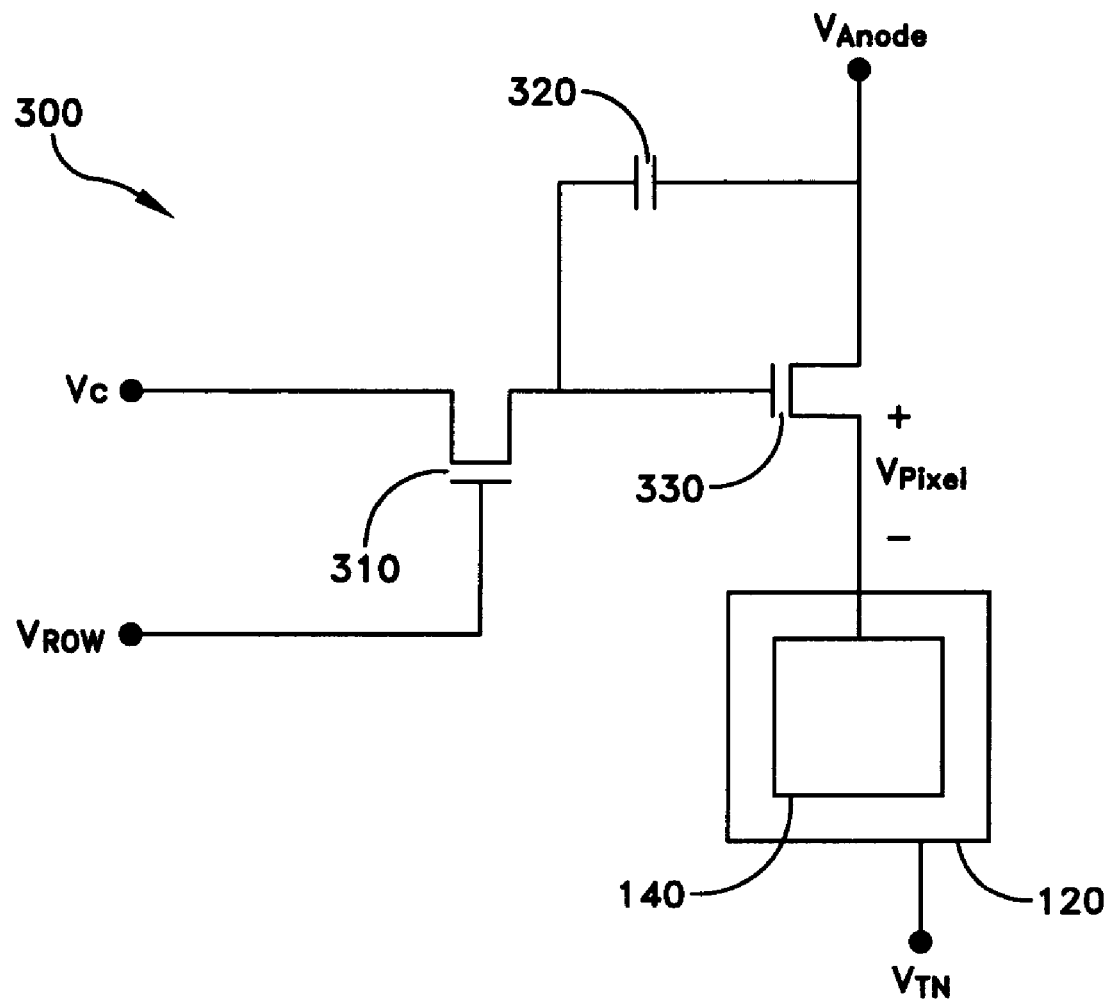
FIG. 3 illustrates a circuit for driving the control frame of FIG. 2 according to an aspect of the present invention.

According to an aspect of the present invention, control of one or more of the TFTs associated with the display device of the present invention may be accomplished using the circuit 300 of FIG. 3. Circuit 300 includes first and second transistors 310, 330 and capacitor 320 electrically interconnect with a pixel, e.g., pad 140, FIG. 1.

In general, the voltage used to select the row ($V_{ROW}$) is equal to the fully "on" voltage of the column (Vc). The row voltage in this case causes the pass transistor 310 to conduct. The resistance of pass transistor 310, capacitor 320 and the write time of each selected pixel row determines the voltage at the gate of transistor 330, as compared to Vc. Using a voltage $V_{ROW}$ higher than the fully "on" voltage (Vc) increases the conduction of transistor 310, reducing its resistance and resulting in an increase in pixel voltage ($V_{Pixel}$) and enhanced brightness. Thus, the selection voltage for the row is higher than the highest column voltage, thereby causing transistor 310 to turn on heavily, thereby reducing the associated resistance and providing a greater voltage on the gate of transistor 330. $V_{ANODE}$ is the power supply voltage, and may be on the order of about 40V. In such a configuration, $V_{PIXEL\ LOW}$ may be on the order of around 6-12 V.

While there has been shown, described, and pointed out fundamental novel features of the present invention as applied to preferred embodiments thereof, it will be understood that various omissions and substitutions and changes in the apparatus described, in the form and details of the devices disclosed, and in their operation, may be made by those skilled in the art without departing from the spirit of the present invention. For example, the control frame described previously may be used with any display which uses electrons or charged particles to form an image, such as an LVND, Electrophoretic, or VFD display. As discussed above, it is also understood that the present invention may be applied to flexible displays in order to form an image thereon.

It is expressly intended that all combinations of those elements that perform substantially the same function in substantially the same way to achieve the same results are within the scope of the invention. Substitutions of elements from one described embodiment to another are also fully intended and contemplated.

What is claimed is:

1. A flat panel display comprising;
a plurality of electrically addressable pixels, each of said pixels being electrically addressable by including a conductive pad that is coated with a phosphor;

a plurality of thin-film transistor (TFT) driver circuits each being electrically coupled to an associated one of said plurality of said pixels;

a passivating layer on said thin-film transistor driver circuits and at least partially around said pixels;

a conductive frame on said passivating layer, wherein conductor elements of said frame are positioned between said pixels to substantially surround each of said pixels;

a plurality of nanostructures on said conductive frame;

a substrate supporting said pixels including said phosphor coated conductive pad, said TFT driver circuits, said passivating layer and said conductive frame, means for applying a known voltage to said conductive frame, said known voltage being less than an electron emission threshold voltage of said nanostructures; and means for addressing one of said pixels using said associated driver circuit, wherein said addressing causes application of a voltage to said pixel to create a potential difference greater than said emission threshold voltage.

2. The display of claim 1, wherein said substrate is transparent.

3. The display of claim 1, further comprising:

a second substrate oppositely disposed from said substrate supporting said pixels, said driver circuits, said passivating layer and said frame, wherein said second substrate is transparent.

4. The display of claim 1, wherein said conductive frame comprises a plurality of parallel rows of conductors.

5. The display of claim 1, wherein said conductive frame comprises a plurality of parallel columns of conductors.

6. The display of claim 1, wherein said conductive frame comprises a matrix of row and column conductors defining a plurality of cells each associated with one of said pixels.

7. The display of claim 1, further comprising at least one contact pad electrically coupled to said conductive frame.

8. The display of claim 1, wherein said nanostructures comprise carbon nanotubes.

9. The display of claim 1, wherein:

said driver circuit comprises at least one transistor coupled to said conductive pad.

10. The display of claim 1, wherein:

said driver circuit comprises a first transistor coupled to said conductive pad and a second transistor and capacitor coupled to a gate of said first transistor.

11. A display comprising:

a substrate;

a plurality of electrically addressable pixels supported on said substrate, said electrically addressable pixels being coated with a phosphor, a passivating layer covering said substrate;

a conductive frame supported on said passivating layer, wherein elements of said conductive frame are positioned between said pixels to substantially surround each of said pixels; and a plurality of nanostructures on said conductive frame;

means for applying a predetermined voltage to said conductive frame, said predetermined voltage being less than an electronic emission threshold voltage of said nanostructures;

means for addressing one of said pixels to apply a voltage to selected ones of said addressable pixels to create a voltage difference greater than said electronic emission threshold voltage.

12. The display of claim 11, wherein said substrate is transparent.

13. The display of claim 11, further comprising:

a second substrate oppositely disposed from said substrate, wherein said second substrate is transparent.

14. The display of claim 11, wherein said conductive frame comprises a matrix of row and column conductors defining a plurality of cells each associated with one of said pixels.

15. The display of claim 11, further comprising at least one contact pad electrically coupled to said conductive frame.

16. The display of claim 11, wherein said nanostructures comprise carbon nanotubes.

17. The display of claim 11, wherein each said pixel comprises a conductive pad and at least one transistor coupled to said conductive pad.

18. The display of claim 11, wherein each said pixel comprises a conductive pad, a first transistor coupled to said conductive pad, and a second transistor and capacitor coupled to a gate of said first transistor.

* * * * *